US008085257B2

United States Patent
Taguchi et al.

(10) Patent No.: US 8,085,257 B2
(45) Date of Patent: Dec. 27, 2011

(54) NEGATIVE STEP-UP CHARGE PUMP CIRCUIT, LCD DRIVER IC, AND LIQUID CRYSTAL DISPLAY DEVICE

(75) Inventors: Haruo Taguchi, Kyoto (JP); Hidekazu Kojima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1016 days.

(21) Appl. No.: 11/725,953

(22) Filed: Mar. 19, 2007

(65) Prior Publication Data

US 2007/0216673 A1   Sep. 20, 2007

(30) Foreign Application Priority Data

Mar. 20, 2006  (JP) .................... 2006-077172

(51) Int. Cl.
*G06F 3/038* (2006.01)
*H03L 7/06* (2006.01)
(52) U.S. Cl. .......... 345/211; 345/204; 327/157
(58) Field of Classification Search ............ 345/211; 327/157
See application file for complete search history.

(56) References Cited

U.S. PATENT DOCUMENTS

| | | | | |
|---|---|---|---|---|
| 5,168,174 A | * | 12/1992 | Naso et al. ............ | 327/540 |
| 5,532,915 A | * | 7/1996 | Pantelakis et al. ..... | 363/60 |
| 5,821,805 A | * | 10/1998 | Jinbo ..................... | 327/537 |
| 5,841,703 A | * | 11/1998 | Wojciechowski ....... | 365/189.09 |
| 6,023,188 A | * | 2/2000 | Lee et al. ................ | 327/536 |
| 6,157,242 A | * | 12/2000 | Fukui ..................... | 327/536 |
| 6,177,830 B1 | * | 1/2001 | Rao ........................ | 327/536 |
| 6,359,947 B1 | * | 3/2002 | Rao ........................ | 375/374 |
| 6,617,796 B2 | * | 9/2003 | Sasaki et al. ........... | 315/169.1 |
| 6,727,681 B2 | * | 4/2004 | Morita .................... | 323/282 |
| 6,864,525 B2 | * | 3/2005 | Kaneko et al. ......... | 257/299 |
| 7,199,627 B2 | * | 4/2007 | Kozaki ................... | 327/157 |
| 7,259,611 B2 | * | 8/2007 | Tanimoto ............... | 327/536 |
| 2002/0089369 A1 | | 7/2002 | Ikeda | |
| 2005/0195149 A1 | | 9/2005 | Ito | |
| 2007/0216620 A1 | * | 9/2007 | Nagai et al. ............ | 345/87 |

FOREIGN PATENT DOCUMENTS

| | | |
|---|---|---|
| JP | 08-103070 | 4/1996 |
| JP | 2002-009250 | 11/2002 |
| JP | 2003-197793 | 7/2003 |
| JP | 2005-284271 | 10/2005 |

* cited by examiner

*Primary Examiner* — Bipin Shalwala
*Assistant Examiner* — Benyam Ketema
(74) *Attorney, Agent, or Firm* — Fish & Richardson P.C.

(57) ABSTRACT

In a negative step-up charge pump circuit according to the present invention, of a plurality of stages of charge transfer transistors and an output transistor, the former-stage transistors are P channel type field effect transistors, and the later-stage transistors are N channel type field effect transistors. With such configuration, it is possible to avoid start-up failure and current driving performance deterioration resulting from an increase in the number of stages of step-up units without complicating processes and increasing the chip size.

10 Claims, 4 Drawing Sheets

NEGATIVE STEP-UP CHARGE PUMP CIRCUIT, LCD DRIVER IC, AND LIQUID CRYSTAL DISPLAY DEVICE

This application is based on Japanese Patent Application No. 2006-077172 filed on Mar. 20, 2006, the contents of which are hereby incorporated by reference.

BACKGROUND OF THE INVENTION

1. Field of the Invention

The present invention relates to negative step-up charge pump circuits that negatively step up an input voltage to produce a desired output voltage, and to LCD driver ICs and liquid crystal display devices incorporating such negative step-up charge pump circuits.

2. Description of Related Art

Conventionally, charge pump circuits are known that produce a desired output voltage by positively or negatively stepping up an input voltage through a plurality of stages of step-up units built with charge transfer transistors and charge transfer capacitors.

In the conventional charge pump circuits described above, field effect transistors are usually used as the charge transfer transistors, and their channel types are uniformly provided as either an N channel type or a P channel type throughout all the stages.

As an example of conventional technology related to the present invention, JP-A-H8-103070 (hereinafter "Patent Document 1") discloses and proposes charge pump circuits whose substrate potential is mutually different between transistors forming, of a plurality of stages of step-up units, former-stage step-up units and transistors forming later-stage step-up units.

As another example of conventional technology related to the invention, JP-A-2003-197793 (hereinafter "Patent Document 2", see FIG. 7 in particular) discloses and proposes charge pump circuits having four charge transfer transistors, those of which in the former stage are N channel types and the other of which in the later-stage are P channel types, and each of which has a drain and a substrate so connected as to be at the same potential.

With the conventional charge pump circuits described above, unlike a case where a switching regulator (chopper type regulator) is used, a desired step-up voltage can be produced without requiring a harmonic noise shield and an external coil.

However, as described above, with the conventional configuration in which the charge transfer transistors are uniformly provided as an N channel type or a P channel type throughout all the stages, there is an upper limit of the number of step-up stages upon formation of negative step-up charge pump circuits, thus resulting in risk of failure to produce a desired output voltage, for the following reasons.

Specifically, with the conventional configuration in which the charge transfer transistors are all provided as N channel types, when each of the transistors is formed by a process involving a single well alone, back gate potentials cannot be separated individually, which inevitably leads to necessity to set the back gate potentials of all the transistors at the minimum potential of the system (output potential of negative polarity). Therefore, a more former-stage transistor demonstrates tendency that its source potential and back gate potential differ from each other, and thus the more former-stage transistor is more likely to have difficulty in transition to the ON-state by back gate effect. Thus, for the conventional charge pump circuits described above, from a viewpoint of preventing start up failure, the number of the step-up units cannot be increased thoughtlessly.

On the other hand, with the conventional configuration in which the charge transfer transistors are all provided as P channel types, the minimum potential of the system (output potential of negative polarity) is applied as the gate potential of each transistor, and thus a more later-stage transistor demonstrates tendency that its potential between the gate and the source decreases and thus its current driving performance deteriorates. Thus, in the conventional charge pump circuits, from a viewpoint of maintaining desired current driving performance, the number of its step-up units cannot be increased thoughtlessly. It is possible to provide configuration in which a more later-stage transistor is sized larger to maintain the desired current driving performance, but this configuration is extremely inefficient in terms of chip area and thus fails to serve as practical solution.

The conventional technology of patent document 1 provides configuration which solve the problem described above by electrically separating the former-stage transistors and the later-stage transistors from each other to provide different potentials as back gate potentials of the respective transistors. Thus, this technology involves complication of processes and thus is essentially different from the invention of the application.

With the conventional technology of patent document 2, as indicated in FIG. 7 of this document and also its description, power sources and GND side input voltages of level shift circuits S1 to S4 are selected so that a value of the voltage Vgb between the gate and substrate of transistors M1 to M4 becomes equal to that of voltage Vgd between the gate and the drain, thereby complicating the circuits.

SUMMARY OF THE INVENTION

In view of the problem described above, it is an object of the present invention to provide negative step-up charge pump circuits capable of avoiding start-up failure and current driving performance deterioration resulting from an increase in the stages of step-up units without complicating processes and increasing the chip size, and also to provide an LCD driver IC and a liquid crystal display device provided with such negative step-up charge pump circuits.

To achieve the above object, a negative step-up charge pump circuit according to one aspect of the invention is a charge pump circuit which negatively steps up an input voltage by using a plurality of stages of step-up units formed of charge transfer transistors and charge transfer capacitors to thereby produce a desired output voltage, in which of the charge transfer transistors, the former-stage transistors are P channel type field effect transistors and the later-stage transistors are N channel type field effect transistors.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Hereinafter, the present invention will be described by way of an example in which it is applied to a power supply circuit (DC/DC converter) for a liquid crystal display device incorporated in a cellular phone terminal.

Figure 1:
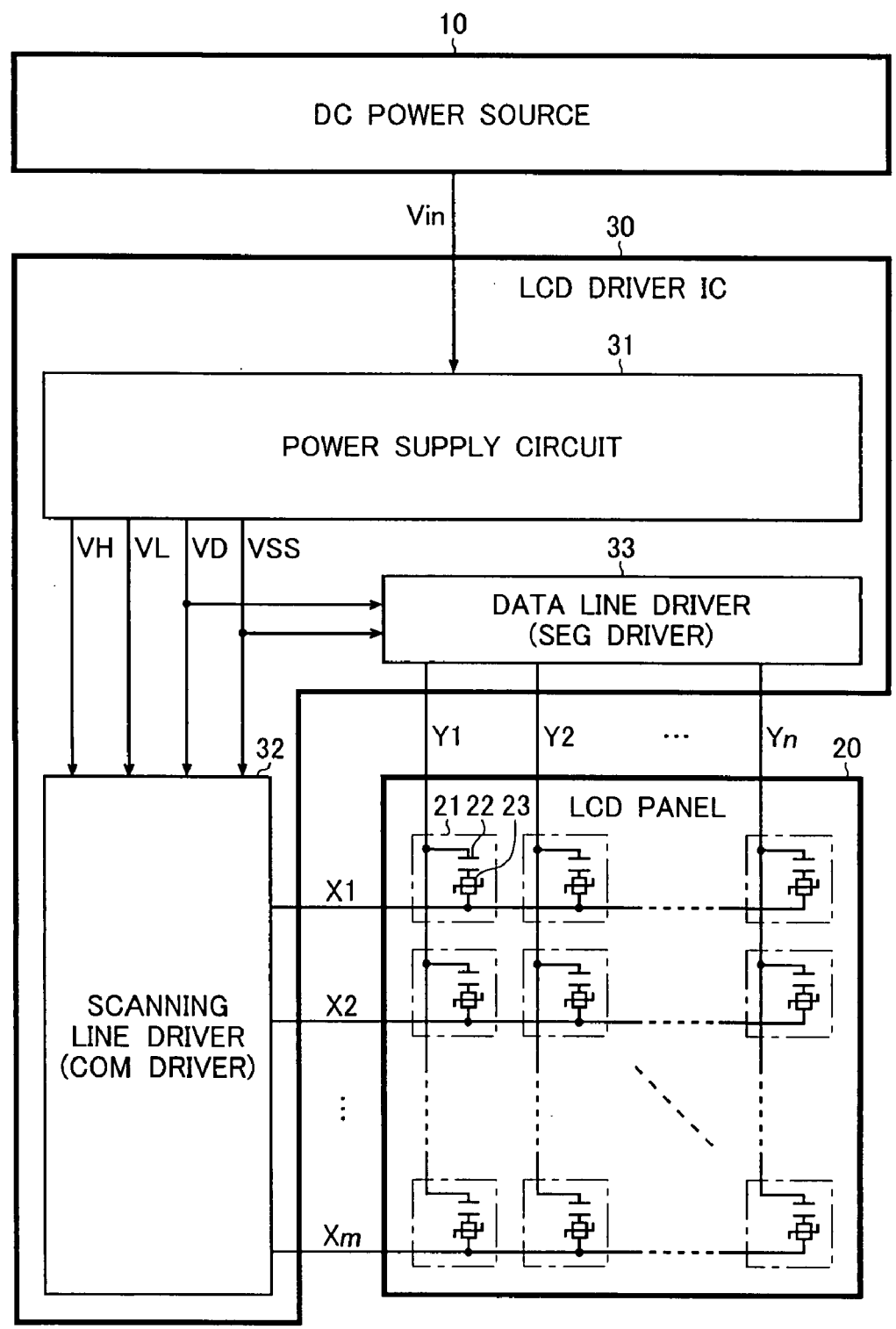
FIG. 1 is a block diagram showing one embodiment of a cellular phone terminal according to the present invention.

FIG. 1 is a block diagram showing one embodiment of a cellular phone terminal according to the invention. As shown in the figure, this cellular phone terminal includes a DC (direct-current) power source 10 that supplies electric power to the terminal, a liquid crystal display panel 20 (hereinafter "LCD panel 20") on which the terminal displays information etc., and an LCD driver IC 30 that drives and controls the LCD panel 20. Needless to say, the cellular phone terminal of this embodiment further includes, although unillustrated, other functional blocks with which it achieves its essential capabilities (communication and other capabilities), such as a transmitter/receiver circuit, a loudspeaker, a microphone, a display, an operation panel, and a memory.

The DC power source 10 supplies electric power to different parts of the terminal; it may be a rechargeable battery such as a lithium-ion battery, or an AC/DC converter that produces a DC voltage from a commercial AC (alternating-current) voltage.

The LCD panel 20 is of the TFD (thin-film diode) active-matrix type; specifically, it has a plurality of scanning lines X1 to Xm (where m is a prescribed natural number) laid in the horizontal direction, and has a plurality of data lines Y1 to Yn (where n is a prescribed natural number) laid in the vertical direction, with a liquid crystal cell 22 forming a pixel 21 located at each intersection between those scanning and data lines, the liquid crystal cell 22 being driven by a corresponding active element (a thin-film diode 23 in this embodiment) being turned ON and OFF.

For the sake of simplicity, the embodiment deals with a configuration where each pixel 21 contains one liquid crystal cell 22 and one thin-film diode 23 (i.e., a configuration for monochrome display). This, however, is not meant to limit the application of the invention in any way; the invention is applicable also to, for example, a configuration for color display with three colors, namely R, G, and B, in which case each pixel may contain three liquid crystal cells and three thin-film diodes corresponding to R, G, and B respectively.

The embodiment deals with a configuration where, in each pixel 21, the liquid crystal cell 22 and the thin-film diode 23 are serially connected, with the liquid crystal cell 22 connected to the corresponding data line, one of Y1 to Yn, and the thin-film diode 23 connected to the corresponding scanning line, one of X1 to Xm. This, however, is not meant to limit the application of the invention in any way; the invention is applicable also to, for example, a configuration where the liquid crystal cell 22 and the thin-film diode 23 are connected the other way around.

The embodiment deals with a TFD active-matrix LCD panel, which uses thin-film diodes as active elements. This, however, is not meant to limit the application of the invention in any way; the invention is applicable also to, for example, a TFT (thin-film transistor) active-matrix LCD panel, which uses thin-film transistors as active elements.

The LCD driver IC 30 includes a power supply circuit 31, a scanning line driver (common driver, or COM driver) 32, and a data line driver (segment driver, or SEG driver) 33.

The power supply circuit 31 operates from a supply voltage Vin fed from the DC power source 10. The power supply circuit 31 produces a reference voltage VSS and other internal voltages (VH, VL, and VD) from the supply voltage Vin, and feeds them to different parts (such as the scanning line driver 32 and the data line driver 33) of the IC.

The internal voltages VH and VL vary with the ambient temperature (e.g., the internal voltage VH varies between +5 V and +22.5 V, and the internal voltage VL varies between −18.5 V and −1 V). By contrast, the internal voltage VD is produced from a band gap voltage, which does not depend on the ambient temperature, and is therefore constant (e.g., +4 V). The reference voltage VSS equals the ground voltage (0 V).

According to image signals and timing control signals (of which none is illustrated) fed in from outside the IC, the scanning line driver 32 and the data line driver 33 produce scanning signals and data signals with which to drive the LCD panel 20, and feed those signals via the scanning lines X1 to Xm and the data lines Y1 to Yn to the LCD panel 20.

Figure 2:
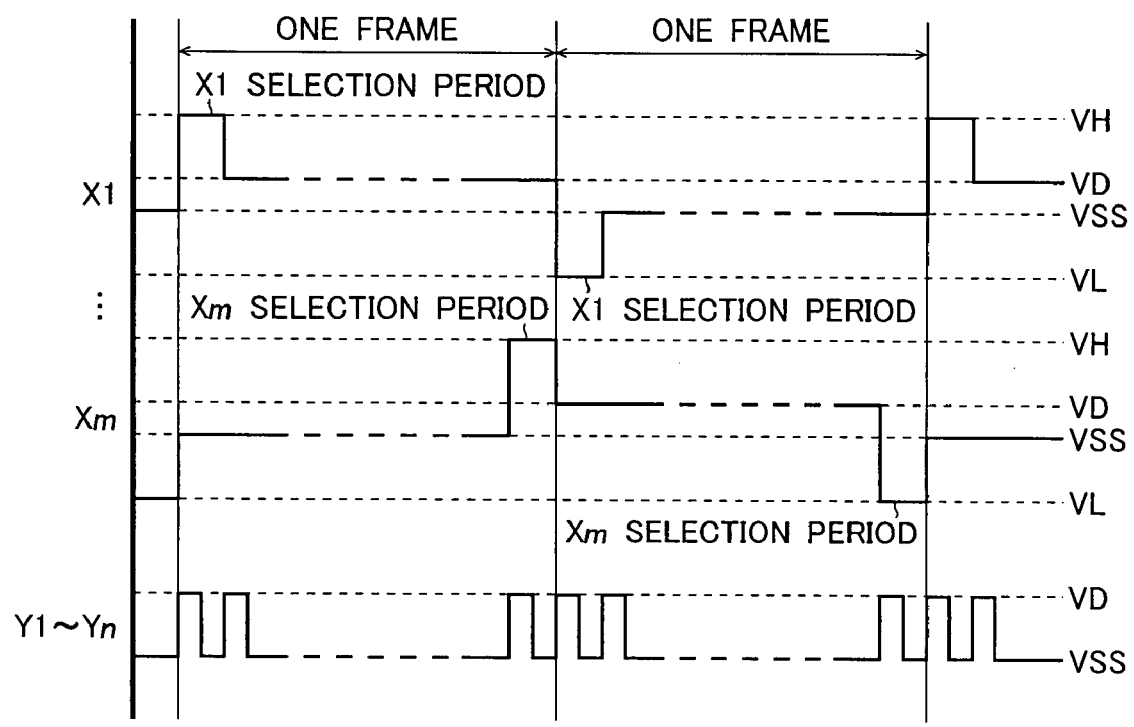
FIG. 2 is a timing chart showing an example of scanning signals and data signals.

Here, the LCD panel 20 is driven in the following manner (by so-called four-level driving). The scanning signals fed via the scanning lines X1 to Xm to the LCD panel 20 are controlled as shown in FIG. 2. Specifically, within each frame period, the scanning lines X1 to Xm are selected one after the next, and one at a time, so that, during the period in which a given scanning line is selected (i.e., during its selection period), either a positive, first selection voltage (the internal voltage VH) or a negative, second selection voltage (the internal voltage VL), alternately between consecutive frames, is applied to that scanning line and, during the period in which a given scanning line is not selected (i.e., during its non-selection period), either a first non-selection voltage (the internal voltage VD) or a second non-selection voltage (the reference voltage VSS), alternately between consecutive frames, is applied to that scanning line. This manner of driving helps reduce degradation of image quality compared with one in which the polarity of the selection voltage applied in consecutive frame periods remains constant.

The data signals fed via the data lines Y1 to Yn to the LCD panel 20 are controlled as shown in FIG. 2. Specifically, with either the internal voltage VD or the reference voltage VSS applied to each data line at a time, the data signal on that signal line is a binary signal, and its ON duty within the selection period of a given scanning line is so controlled as to control the gray scale level of the corresponding pixel.

Thus, to produce the scanning signals, the scanning line driver 32 requires, in addition to the reference voltage VSS, the internal voltages (VH, VL, and VD) having three different levels; to produce the data signals, the data line driver 33 requires the reference voltage VSS and the internal voltage VD.

Accordingly, in the example under discussion, the power supply circuit 31 includes, to produce a negative voltage needed to produce the internal voltage VL, a negative step-up charge pump circuit that negatively steps up the supply voltage Vin to thereby produce a desired output voltage Vout.

Figure 3:
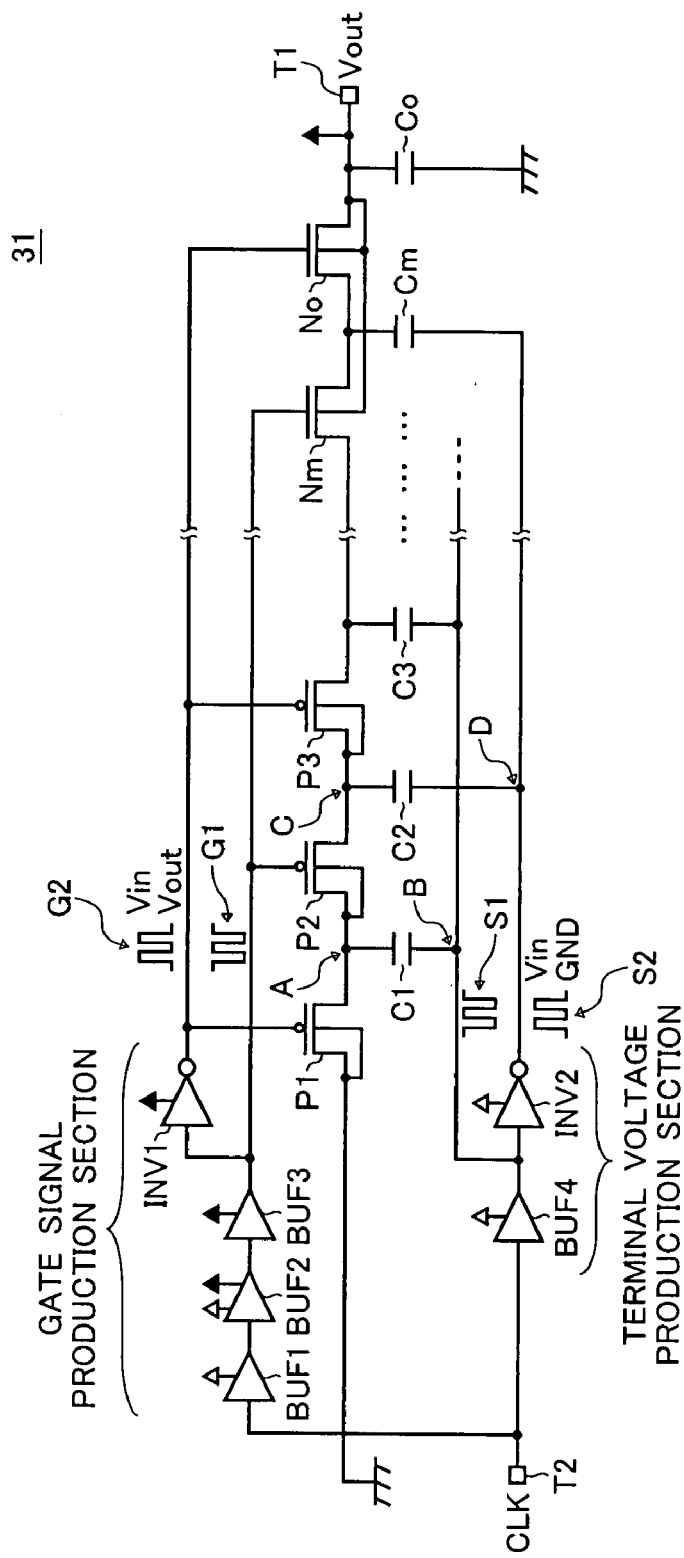
FIG. 3 is a circuit block diagram showing one example of configuration of a power supply circuit 31.

FIG. 3 is a circuit block diagram showing an example of configuration of the power supply circuit 31 (negative step-up charge pump circuit in particular).

As shown in FIG. 3, the negative step-up charge pump circuit in this embodiment includes first to m-th (≧2) charge transfer transistors P1, P2, P2, P3, and Nm, an output transistor No, first to m-th charge transfer capacitor C1 to Cm, an output capacitor Co, buffers BUF1 to BUF4, and inverters INV1 and INV2.

The first to m-th charge transfer transistors (P1, P2, P3, and Nm) are serially connected from ground in the order shown in the figure. The output transistor No is serially connected between the charge transfer transistor Nm and an output voltage output terminal T1.

Of the plurality of stages of transistors mentioned above, the first to (m−1)-th charge transfer transistors P1, P2, P3, ..., and P(m−1), not shown) are P-channel field-effect transistors, and the m-th charge transfer transistor Nm and the output transistor No are N-channel field-effect transistors.

To simplify the fabrication process, the m-th charge transfer transistor Nm and the output transistor No are both formed by a process whereby an N-type single well alone is formed on a P-type semiconductor substrate. Thus, the backgates of these transistors are connected to the lowest-potential point of the entire system, namely the output voltage output terminal T1. By contrast, the first to (m−1)-th charge transfer transistors P1, P2, P3, ..., P(m−1)) have their backgates connected to their own sources respectively. This helps minimize the ON-state resistance of these transistors.

One ends of the first to m-th charge transfer capacitors (C1 to Cm) are connected to a connection node between the switches mentioned above. One end of the output capacitor Co is connected to the output voltage output terminal T1, and the other end of the output capacitor Co is grounded.

The buffers BUF1 to BUF3 and the inverter INV1 together serve to produce gate signals; specifically, they produce: a gate signal G1, which is a pulse signal that changes its level between the supply voltage Vin and the output voltage Vout in synchronism with a clock signal CLK fed in via a clock signal input terminal T2; and an inverted gate signal G2, which is a logical inversion of the gate signal G1, and also serve to feed the gate signal G1 and the inverted gate signal G2 so that the first to m-th charge transfer transistors (P1, P2, P3, ..., Nm) and the output transistor No are each in different ON/OFF state from those adjacent thereto. The buffers BUF1 to BUF3 (buffer BUF2 in particular) produce the gate signal G1 by shifting the amplitude level of the clock signal CLK to a desired amplitude level, and the inverter INV1 produces the inverted gate signal G2 by inverting the logic level of the gate signal G1.

Figure 4:
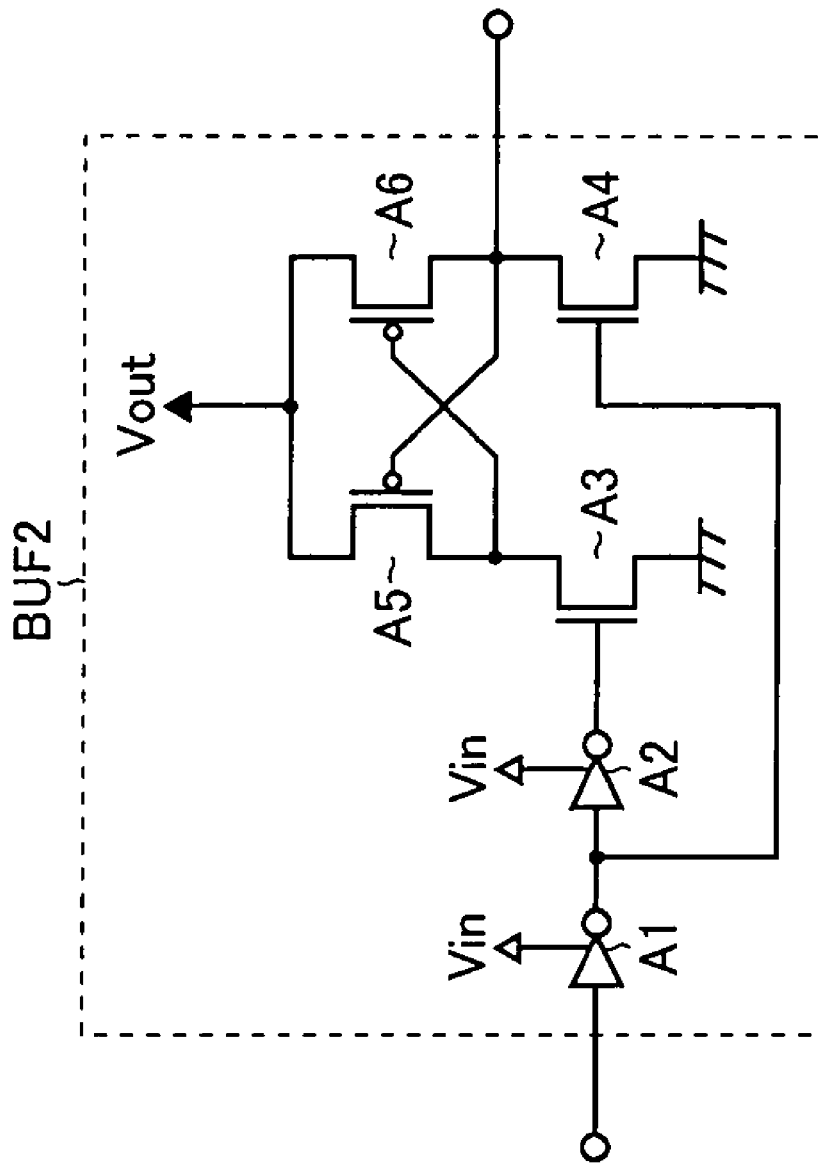
FIG. 4 is a circuit diagram showing one example of configuration of a buffer BUF 2.

FIG. 4 is a circuit diagram showing one example of the buffer BUF 2.

As shown in FIG. 4, the buffer BUF2 includes: inverters A1 and A2, N channel type field effect transistors A3 and A4, and P channel type field effect transistors A5 and A6.

The input contact of the inverter A1 corresponds to the input contact of the buffer BUF2. The output contact of the inverter A1 is connected to the input end (contact) of the inverter A2 and also connected to the gate of the transistor A4. The output contact of the inverter A2 is connected to the gate of the transistor A3. The inverters A1 and A2 are driven by the supply voltage Vin.

The sources of the transistors A3 and A4 are each grounded. The drain of the transistor A3 is connected to the drain of the transistor A5 and also connected to the gate of the transistor A6. The drain of the transistor A4 is connected to the drain of the transistor A6 and also connected to the gate of the transistor A5. The drain of the transistor A4 corresponds to the output contact of the buffer BUF2. The sources of the transistors A5 and A6 are each connected to a point to which the output voltage Vout is applied.

For the configuration of the buffer BUF2, various configurations other than those mentioned above can be applied.

The buffer BUF4 and the inverter INV2 together serve to produce terminal voltages; specifically, they produce: a terminal voltage S1, which is a pulse signal that changes its level between the supply voltage Vin and the ground voltage (GND) in synchronism with the clock signal CLK mentioned above; and an terminal voltage S2, which is a logical inversion of the terminal voltage S1, and also serve to feed the terminal voltage S1 and the inverted terminal voltage S2 so that the first to m-th charge transfer capacitors (C1 to Cm) are each in different voltage level from those adjacent thereto. The inverter INV2 produces the inverted terminal voltage S2 by inverting the logic level of the terminal voltage S1.

A white hollow triangular mark put at the positive electrode of the buffers BUF1 to BUF4 and the inverters INV1 and INV2 indicates that the supply voltage Vin is applied there. A black hollow triangular mark indicates that the output voltage Vout is applied there.

Next, operation of the negative step-up charge pump circuits with the configuration described above will be described.

First, consider the step-up unit in the first stage. When the clock signal CLK turns high, the gate signal G1 turns high, and the inverted gate signal G2 turns low. Thus, the transistor P1 turns ON, and the transistor P2 turns OFF. At this point, the terminal voltage S1 turns high, and the inverted terminal voltage S2 turns low. Thus, the ground voltage is applied to one end (the node A) of the charge transfer capacitor C1, and the terminal voltage S1 (Vin), now high, is applied to the other end (the node B) of the charge transfer capacitor C1. Thus, the charge transfer capacitor C1, with a lower potential at the node A and a higher potential at the node B, is charged until the potential difference across it becomes equal to the supply voltage Vin.

After the charge transfer capacitor C1 is fully charged, when the clock signal CLK turns low, now the gate signal G1 turns low, and the inverted gate signal G2 turns high. Thus, the charge transfer transistor P1 turns OFF, and the charge transfer transistor P2 turns ON. At this point, the terminal voltage S1 turns low, and the inverted terminal voltage S2 turns high. Thus, the potential at the node B falls from the supply voltage Vin to the ground voltage GND. Here, since the charge transfer capacitor C1 has previously been charged so that now a potential difference approximately equal to the supply voltage Vin is present across it, when the potential at the node B falls to the ground voltage GND, simultaneously the potential at the node A falls to −Vin (=ground voltage GND minus charge voltage Vin).

Next, consider the step-up unit in the second stage. The potential (−Vin) at the node A is applied via the charge transfer transistor P2 to one end (the node C) of the charge transfer capacitor C2, and the inverted terminal voltage S2, now high (Vin) is applied to the other end (the node D) of the charge transfer capacitor C2. Thus, the charge transfer capacitor C2, with a lower potential at the node C and a higher potential at the node D, is charged until the potential difference across it becomes substantially equal to twice the supply voltage Vin.

In the step-up units in the succeeding stages, switching and charging/discharging similar to those described above are repeated until eventually the electric charge stored in the charge transfer capacitor Cm in the m-th stage is transferred to the output capacitor Co. As a result, a negatively stepped-up voltage (−m×Vin) m times the supply voltage Vin is obtained as the output voltage Vout.

As described above, the negative step-up charge pump circuit of this embodiment is a charge pump circuit which negatively steps up a supply voltage Vin by use of the m-number of stages of step-up units to thereby produce a desired output voltage Vout. Of a plurality of stages of charge transfer transistors and an output transistor serially connected, the former stage transistors are formed as P channel type field effect transistors (P1, P2, P3, ...), and the later-stage transistors are formed as N channel type field effect transistors (Nm, No).

Specifically, in the negative step-up charge pump circuit of this embodiment, the later-stage charge transfer transistors (Nm, No) are built as N-channel field-effect transistors, which are ON when their gate voltage is high. This makes it possible to obtain sufficiently high gate-source voltages in later-stage transistors in their ON state without making them any larger and thereby to give them sufficiently high current driving performance, which is unachievable with the conventional configuration, where P-channel field-effect transistors are adopted in all the stages.

Moreover, in the negative step-up charge pump circuit of this embodiment, only the m-th charge transfer transistor Nm and the output transistor No are built as N-channel field-effect transistors. Thus, even when these N-channel field-effect transistors are formed by a process involving a single well alone, their source potential and backgate potential do not differ greatly, and this helps reduce the incidence of failure of the charge pump circuit at start-up resulting from the backgate effect, which is unachievable with the conventional configuration, where N-channel field-effect transistors are adopted in all the stages.

As described above, with the negative step-up charge pump circuit of this embodiment, it is possible to avoid start-up failure and current driving performance deterioration resulting from an increase in the number of stages of step-up units, without complicating the process or increasing the chip size.

The embodiments described above deal with cases where the invention is applied to a power supply circuit for a liquid crystal display device incorporated in a cellular phone terminal. This, however, is not meant to limit the application of the invention in any way; the invention finds wide application in negative charge pump circuits in general that step up an input voltage to produce a desired output voltage.

The invention is widely applicable to negative step-up charge pump circuits whose number m of step-up stages is two or more, but as in a case where when the invention is applied to a negative step-up charge pump circuit whose number m of step-up stages is 5 or more, a larger number m of step-up stages exhibits larger effect.

In addition to the embodiment described above, various modification can be made to the configuration of the invention without deviating from the sprit of the invention.

For example, for gate signal producing means and terminal voltage producing means, if switching and charging/discharging controls can be made in the same manner as described above, various configurations in addition to that of the embodiment described above can be adopted.

The embodiment described above only refers to a case of negative step-up voltage, but the same effect can be provided for a case of positive step-up voltage by switching between NMOS and PMOS.

If the number m of step-up stages is odd, as shown in FIG. 3, the gate signal G1, which is a logical inversion of the inverted gate signal G2 applied to the charge transfer transistors (P1, P3, . . . ) in odd-numbered stages, may be applied to the charge transfer transistor Nm in the m-th stage, and the inverted gate signal G2, which is a logical inversion of the gate signal G1 applied to the charge transfer transistors (P2, . . . ) in even-numbered stages, may be applied to the output transistor No. On the other hand, if the number m of step-up stages is even, the inverted gate signal G2, which is a logical inversion of the gate signal G1 applied to the charge transfer transistors (P2, . . . ) in even-numbered stages, may be applied to the charge transfer transistor Nm in the m-th stage, and the gate signal G1, which is a logical inversion of the inverted gate signal G2 applied to the charge transfer transistors (P1, P3 . . . ) in odd-numbered stages, may be applied to the output transistor No. In sum, the gate signal G1 and the inverted gate signal G2 may be applied in any logic as long as the first to m-th charge transfer transistors and the output transistor are put in different open/close states from those adjacent thereto.

Now, effect provided by the invention will be described. According to the invention, negative step-up charge pump circuits capable of avoiding start-up failure and current driving performance deterioration resulting from an increase in the stages of step-up units without complicating processes and increasing the chip size, and also to provide an LCD driver IC and a liquid crystal display device provided with such negative step-up charge pump circuits.

For industrial applicability of the invention, the invention provides technology useful in increasing the number of step-up stages of a negative step-up charge pump circuit.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. A negative step-up charge pump circuit comprising:
a plurality of stages of step-up units formed of charge transfer transistors and charge transfer capacitors, each of the charge transfer transistors having a source, a drain, a gate, and a backgate, and the source-drain of the charge transfer transistors being connected in series;
a first gate signal source arranged to generate a first train of pulses; and
a second gate signal source arranged to generate a second train of pulses which is a logical inversion of the first train of pulses,
wherein the negative step-up charge pump circuit negatively steps up an input voltage by using the plurality of stages of step-up units to thereby produce a desired output voltage at an output voltage output terminal,
wherein, the charge transfer transistor in the first stage on the input voltage side is a P channel type field effect transistor, and the charge transfer transistors in the last two stages on the output voltage side are N channel type field effect transistors,
wherein the N channel type field effect transistors include:
a first N channel type field effect transistor connected to the P channel type field effect transistor; and
a second N channel type field effect transistor connected to the first N channel type field effect transistor and also to the output voltage output terminal,
wherein the first N channel type field effect transistor has a drain connected to a drain of the P channel type field effect transistor,
wherein the second N channel type field effect transistor has a source connected to the output voltage output terminal, has a drain connected to a source of the first N channel type field effect transistor, and has a backgate connected to a backgate of the first N channel type field effect transistor and also to the output voltage output terminal,
wherein the gates of the charge transfer transistors in every other stage are commonly driven by the first train of pulses regardless of the step-up units, and the gates of the charge transfer transistors in the remaining stages are commonly driven by the second train of pulses regardless of the step-up units, wherein the negative step-up charge pump circuit further comprises:
a first signal line to which the first train of pulses is fed, the first signal line being connected to a gate of every (odd-number)-th P channel type field effect transistor; and
a second signal line to which the second train of pulses is fed, the second signal line being connected to a gate of every (even-number)-th P channel type field effect transistor, and
wherein
when there are an even number of P channel type field effect transistors, a gate of the first N channel type field effect transistor is connected to the second signal line, and a gate of the second N channel type field effect transistor is connected to the first signal line, and
when there are an odd number of P channel type field effect transistors, a gate of the first N channel type field effect transistor is connected to the first signal line, and a gate of the second N channel type field effect transistor is connected to the second signal line.

2. An LCD driver IC comprising:
a negative step-up charge pump circuit which produces a drive voltage of a negative polarity for a liquid crystal display panel,
wherein the negative step-up charge pump circuit has:
a plurality of stages of step-up units formed of charge transfer transistors and charge transfer capacitors, each of the charge transfer transistors having a source, a drain, a gate, and a backgate, and the source-drain of the charge transfer transistors being connected in series;
a first gate signal source arranged to generate a first train of pulses; and
a second gate signal source arranged to generate a second train of pulses which is a logical inversion of the first train of pulses,
wherein the negative step-up charge pump circuit negatively steps up an input voltage by using the plurality of stages of step-up units to thereby produce a desired output voltage at an output voltage output terminal,
wherein, the charge transfer transistor in the first stage on the input voltage side is a P channel type field effect transistor, and the charge transfer transistors in the last two stages on the output voltage side are N channel type field effect transistors,
wherein the N channel type field effect transistors include:
a first N channel type field effect transistor connected to the P channel type field effect transistor; and
a second N channel type field effect transistor connected to the first N channel type field effect transistor and also to the output voltage output terminal,
wherein the first N channel type field effect transistor has a drain connected to a drain of the P channel type field effect transistor,
wherein the second N channel type field effect transistor has a source connected to the output voltage output terminal, has a drain connected to a source of the first N channel type field effect transistor, and has a backgate connected to a backgate of the first N channel type field effect transistor and also to the output voltage output terminal,
wherein the gates of the charge transfer transistors in every other stage are commonly driven by the first train of pulses regardless of the step-up units, and the gates of the charge transfer transistors in the remaining stages are commonly driven by the second train of pulses regardless of the step-up units, wherein the negative step-up charge pump circuit further comprises:
a first signal line to which the first train of pulses is fed, the first signal line being connected to a gate of every (odd-number)-th P channel type field effect transistor; and
a second signal line to which the second train of pulses is fed, the second signal line being connected to a gate of every (even-number)-th P channel type field effect transistor, and
wherein
when there are an even number of P channel type field effect transistors, a gate of the first N channel type field effect transistor is connected to the second signal line, and a gate of the second N channel type field effect transistor is connected to the first signal line, and
when there are an odd number of P channel type field effect transistors, a gate of the first N channel type field effect transistor is connected to the first signal line, and a gate of the second N channel type field effect transistor is connected to the second signal line.

3. A liquid crystal display device comprising:
a liquid crystal display panel; and
an LCD driver IC which drives and controls the liquid crystal display panel,
wherein the LCD driver IC has:
a negative step-up charge pump circuit which produces a drive voltage of a negative polarity for a liquid crystal display panel,
wherein the negative step-up charge pump circuit has:
a plurality of stages of step-up units formed of charge transfer transistors and charge transfer capacitors, each of the charge transfer transistors having a source, a drain, a gate, and a backgate, and the source-drain of the charge transfer transistors being connected in series;
a first gate signal source arranged to generate a first train of pulses; and
a second gate signal source arranged to generate a second train of pulses which is a logical inversion of the first train of pulses,
wherein the negative step-up charge pump circuit negatively steps up an input voltage by using the plurality of stages of step-up units to thereby produce a desired output voltage at an output voltage output terminal,
wherein, the charge transfer transistor in the first stage on the input voltage side is a P channel type field effect transistor, and the charge transfer transistors in the last two stages on the output voltage side are N channel type field effect transistors,
wherein the N channel type field effect transistors include:
a first N channel type field effect transistor connected to the P channel type field effect transistor; and
a second N channel type field effect transistor connected to the first N channel type field effect transistor and also to the output voltage output terminal,
wherein the first N channel type field effect transistor has a drain connected to a drain of the P channel type field effect transistor,
wherein the second N channel type field effect transistor has a source connected to the output voltage output terminal, has a drain connected to a source of the first N channel type field effect transistor, and has a backgate connected to a backgate of the first N channel type field effect transistor and also to the output voltage output terminal,
wherein the gates of the charge transfer transistors in every other stage are commonly driven by the first train of pulses regardless of the step-up units, and the gates of the charge transfer transistors in the remaining stages are commonly driven by the second train of pulses regardless of the step-up units, wherein the negative step-up charge pump circuit further comprises:
  a first signal line to which the first train of pulses is fed, the first signal line being connected to a gate of every (odd-number)-th P channel type field effect transistor; and
  a second signal line to which the second train of pulses is fed, the second signal line being connected to a gate of every (even-number)-th P channel type field effect transistor, and
wherein
when there are an even number of P channel type field effect transistors, a gate of the first N channel type field effect transistor is connected to the second signal line, and a gate of the second N channel type field effect transistor is connected to the first signal line, and
when there are an odd number of P channel type field effect transistors, a gate of the first N channel type field effect transistor is connected to the first signal line, and a gate of the second N channel type field effect transistor is connected to the second signal line.

4. A negative step-up charge pump circuit comprising:
first to m (equal to or lager than 2)-th charge transfer transistors serially connected to a ground, each of the charge transfer transistors having a source, a drain, a gate, and a backgate;
an output transistor serially connected between the m-th charge transfer transistor and an output voltage output terminal;
first to m-th charge transfer capacitors having one end connected to a connection node between the transistors;
an output capacitor having one end connected to the output voltage output terminal and another end grounded;
a gate signal production section which, in synchronization with a predetermined clock signal, produces a gate signal which is a train of pulses that changes its level between a supply voltage and an output voltage, and an inverted gate signal which is a logical inversion of the gate signal, and supplies the gate signal and the inverted gate signal to the first to m-th charge transfer transistors and the output transistor so that those adjacent to each other are in mutually different open/close states; and
a terminal voltage production section which, in synchronization with the clock signal, produces a terminal voltage which is a train of pulses that changes its level between a supply voltage and a ground voltage, and an inverted terminal voltage which is a logical inversion of the terminal voltage, and supplies the terminal voltage and the inverted terminal voltage to another ends of the first to m-th charge transfer capacitors so that those adjacent to each other are at mutually different voltage levels,
wherein the negative step-up charge pump circuit negatively steps up the input voltage to thereby produce a desired output voltage,
wherein the first to (m−1)-th charge transfer transistors are P channel type field effect transistors and the m-th charge transfer transistor and the output transistor are N channel type field effect transistors,
wherein the N channel type field effect transistors include:
  a first N channel type field effect transistor connected to the P channel type field effect transistor; and
  a second N channel type field effect transistor connected to the first N channel type field effect transistor and also to the output voltage output terminal,
wherein the first N channel type field effect transistor has a drain connected to a drain of the P channel type field effect transistor,
wherein the second N channel type field effect transistor has a source connected to the output voltage output terminal, has a drain connected to a source of the first N channel type field effect transistor, and has a backgate connected to a backgate of the first N channel type field effect transistor and also to the output voltage output terminal,
wherein the gates of the charge transfer transistors in every other stage are commonly driven by the gate signal regardless of voltage of the connection node between the transistors, while the gates of the remaining charge transfer transistors are commonly driven by the inverted gate signal regardless of voltage of the connection node between the transistors,
wherein the negative step-up charge pump circuit further comprises:
  a first signal line to which the gate signal is fed, the first signal line being connected to a gate of every (odd-number)-th P channel type field effect transistor; and
  a second signal line to which the inverted gate signal is fed, the second signal line being connected to a gate of every (even-number)-th P channel type field effect transistor, and
wherein
when there are an even number of P channel type field effect transistors, a gate of the first N channel type field effect transistor is connected to the second signal line, and a gate of the second N channel type field effect transistor is connected to the first signal line, and
when there are an odd number of P channel type field effect transistors, a gate of the first N channel type field effect transistor is connected to the first signal line, and a gate of the second N channel type field effect transistor is connected to the second signal line.

5. An LCD driver IC comprising:
a negative step-up charge pump circuit which produces a drive voltage of a negative polarity for a liquid crystal display panel,
wherein the negative step-up charge pump circuit has:
first to m (equal to or lager than 2)-th charge transfer transistors serially connected to a ground, each of the charge transfer transistors having a source, a drain, a gate, and a backgate;
an output transistor serially connected between the m-th charge transfer transistor and an output voltage output terminal;
first to m-th charge transfer capacitors having one end connected to a connection node between the transistors; and
an output capacitor having one end connected to the output voltage output terminal and another terminal grounded;
a gate signal production section which, in synchronization with a predetermined clock signal, produces a gate signal which is a train of pulses that changes its level between a supply voltage and an output voltage, and an inverted gate signal which is a logical inversion of the gate signal, and supplies the gate signal and the inverted gate signal to the first to m-th charge transfer transistors and the output transistor so that those adjacent to each other are in mutually different open/close states; and a terminal voltage production section which, in synchronization with the clock signal, produces a terminal voltage which is a train of pulses that changes its level between a supply voltage and a ground voltage, and an inverted terminal voltage which is a logical inversion of the terminal voltage, and supplies the terminal voltage and the inverted terminal voltage to another ends of the first to m-th charge transfer capacitors so that those adjacent to each other are at mutually different voltage levels, wherein the negative step-up charge pump circuit negatively steps up the input voltage to thereby produce a desired output voltage, wherein the first to (m−1)-th charge transfer transistors are P channel type field effect transistors and the m-th charge transfer transistor and the output transistor are N channel type field effect transistors, wherein the N channel type field effect transistors include:
  a first N channel type field effect transistor connected to the P channel type field effect transistor; and
  a second N channel type field effect transistor connected to the first N channel type field effect transistor and also to the output voltage output terminal, wherein the first N channel type field effect transistor has a drain connected to a drain of the P channel type field effect transistor, wherein the second N channel type field effect transistor has a source connected to the output voltage output terminal, has a drain connected to a source of the first N channel type field effect transistor, and has a backgate connected to a backgate of the first N channel type field effect transistor and also to the output voltage output terminal, wherein the gates of the charge transfer transistors in every two of the charge transfer transistors are commonly driven by the gate signal regardless of voltage of the connection node between the transistors, while the gates of the other charge transfer transistors are commonly driven by the inverted gate signal regardless of voltage of the connection node between the transistors, wherein the negative step-up charge pump circuit further comprises:
  a first signal line to which the gate signal is fed, the first signal line being connected to a gate of every (odd-number)-th P channel type field effect transistor; and
  a second signal line to which the inverted gate signal is fed, the second signal line being connected to a gate of every (even-number)-th P channel type field effect transistor, and wherein
when there are an even number of P channel type field effect transistors, a gate of the first N channel type field effect transistor is connected to the second signal line, and a gate of the second N channel type field effect transistor is connected to the first signal line, and when there are an odd number of P channel type field effect transistors, a gate of the first N channel type field effect transistor is connected to the first signal line, and a gate of the second N channel type field effect transistor is connected to the second signal line.

6. A liquid crystal display device comprising:
a liquid crystal display panel; and
an LCD driver IC which drives and controls the liquid crystal display panel;
wherein the LCD driver IC has:
a negative step-up charge pump circuit which produces a drive voltage of a negative polarity for the liquid crystal display panel, wherein the negative step-up charge pump circuit has:
first to m (equal to or lager than 2)-th charge transfer transistors serially connected to a ground, each of the charge transfer transistors having a source, a drain, a gate, and a backgate;

an output transistor serially connected between the m-th charge transfer transistor and an output voltage output terminal;

first to m-th charge transfer capacitors having one end connected to a connection node between the transistors; and an output capacitor having one end connected to the output voltage output terminal and another end grounded;

a gate signal production section which, in synchronization with a predetermined clock signal, produces a gate signal which is a train of pulses that changes its level between a supply voltage and an output voltage, and an inverted gate signal which is a logical inversion of the gate signal, and supplies the gate signal and the inverted gate signal to the first to m-th charge transfer transistors and the output transistor so that those adjacent to each other are in mutually different open/close states; and a terminal voltage production section which, in synchronization with the clock signal, produces a terminal voltage which is a train of pulses that changes its level between a supply voltage and a ground voltage, and an inverted terminal voltage which is a logical inversion of the terminal voltage, and supplies the terminal voltage and the inverted terminal voltage to another ends of the first to m-th charge transfer capacitors so that those adjacent to each other are at mutually different voltage levels, wherein the negative step-up charge pump circuit negatively steps up the input voltage to thereby produce a desired output voltage, wherein the first to (m−1)-th charge transfer transistors are P channel type field effect transistors and the m-th charge transfer transistor and the output transistor are N channel type field effect transistors, wherein the N channel type field effect transistors include:
  a first N channel type field effect transistor connected to the P channel type field effect transistor; and
  a second N channel type field effect transistor connected to the first N channel type field effect transistor and also to the output voltage output terminal, wherein the first N channel type field effect transistor has a drain connected to a drain of the P channel type field effect transistor, wherein the second N channel type field effect transistor has a source connected to the output voltage output terminal, has a drain connected to a source of the first N channel type field effect transistor, and has a backgate connected to a backgate of the first N channel type field effect transistor and also to the output voltage output terminal, wherein the gates of the charge transfer transistors in every two of the charge transfer transistors are commonly driven by the gate signal regardless of voltage of the connection node between the transistors, while the gates of the other charge transfer transistors are commonly driven by the inverted gate signal regardless of voltage of the connection node between the transistors, wherein the negative step-up charge pump circuit further comprises:
  a first signal line to which the gate signal is fed, the first signal line being connected to a gate of every (odd-number)-th P channel type field effect transistor; and a second signal line to which the inverted gate signal is fed, the second signal line being connected to a gate of every (even-number)-th P channel type field effect transistor, and wherein when there are an even number of P channel type field effect transistors, a gate of the first N channel type field effect transistor is connected to the second signal line, and a gate of the second N channel type field effect transistor is connected to the first signal line, and when there are an odd number of P channel type field effect transistors, a gate of the first N channel type field effect transistor is connected to the first signal line, and a gate of the second N channel type field effect transistor is connected to the second signal line.

7. The negative step-up charge pump circuit according to claim 1, wherein each of the backgates of the N channel type field effect transistors are supplied with the output voltage.

8. The negative step-up charge pump circuit according to claim 1, wherein the low level of the first train of pulses are the output voltage.

9. The negative step-up charge pump circuit according to claim 4, wherein each of the backgates of the N channel type field effect transistors are supplied with the output voltage.

10. The negative step-up charge pump circuit according to claim 4, wherein the low level of the gate signal is the output voltage.

* * * * *